United States Patent
Lai et al.

(10) Patent No.: US 7,829,465 B2
(45) Date of Patent: Nov. 9, 2010

(54) METHOD FOR PLASMA ETCHING OF POSITIVELY SLOPED STRUCTURES

(76) Inventors: Shouliang Lai, 11909 Keating Dr., Tampa, FL (US) 33626; Ken Mackenzie, 3885 Talah Rd., Palm Harbor, FL (US) 34684; David Johnson, 920 Belted Kingfisher Dr., Palm Harbor, FL (US) 34683

( * ) Notice: Subject to any disclaimer, the term of this patent is extended or adjusted under 35 U.S.C. 154(b) by 736 days.

(21) Appl. No.: 11/834,127

(22) Filed: Aug. 6, 2007

(65) Prior Publication Data
US 2008/0061029 A1    Mar. 13, 2008

Related U.S. Application Data

(60) Provisional application No. 60/836,483, filed on Aug. 9, 2006.

(51) Int. Cl.
*H01L 21/301* (2006.01)
*H01L 21/461* (2006.01)

(52) U.S. Cl. ............ 438/694; 438/696; 438/700; 438/701; 438/702; 438/703; 438/706; 438/714

(58) Field of Classification Search ............ None
See application file for complete search history.

(56) References Cited

U.S. PATENT DOCUMENTS

| | | | |
|---|---|---|---|
| 4,324,611 A | 4/1982 | Vogel et al. | |
| 4,690,729 A | 9/1987 | Douglas | |
| 5,501,893 A | 3/1996 | Laermer et al. | |
| 6,051,503 A * | 4/2000 | Bhardwaj et al. | 438/705 |
| 6,759,340 B2 * | 7/2004 | Nallan et al. | 438/714 |
| 6,818,564 B1 | 11/2004 | Gormley | |
| 6,849,554 B2 * | 2/2005 | Rattner et al. | 438/706 |
| 7,381,650 B2 * | 6/2008 | Johnson et al. | 438/706 |
| 2004/0178171 A1 | 9/2004 | Nagarajan | |

OTHER PUBLICATIONS

F. Clayton, R. Westerman, D. Johnson, Charecterization of a Manufacturable High Rate GaAs Via Etch Process, GaAsMantech, Conference, 2002, pp. 121-124.
D. Weston, W.L.J. Dauksher, D. Rhine, T. Smekal, Electrochmical Society Proceedings, vol. 2002-17, pp. 227-238.

* cited by examiner

*Primary Examiner*—Duy-Vu N Deo
(74) *Attorney, Agent, or Firm*—Harvey Kauget; Phelps Dunbar LLP

(57) ABSTRACT

The present invention provides a method of etching features in a substrate. The method comprising the steps of placing the substrate on a substrate support in a vacuum chamber. An alternatingly and repeating process is performed on the substrate until a predetermined trench depth and a predetermined sidewall angle are achieved. One part of the process is a deposition step which is carried out by introducing at least one polymer containing gas into the vacuum chamber. A plasma is ignited from the polymer containing gas which is then used to deposit a polymer on the substrate. The other part of the alternatingly and repeating process is an etching step which is carried out by introducing an etchant containing gas, a polymer containing gas and a scavenger containing gas into the vacuum chamber. A plasma is ignited from the etchant containing gas, the polymer containing gas and the scavenger containing gas which is then used to etch the substrate.

26 Claims, 10 Drawing Sheets

Cusping

Prior Art

α

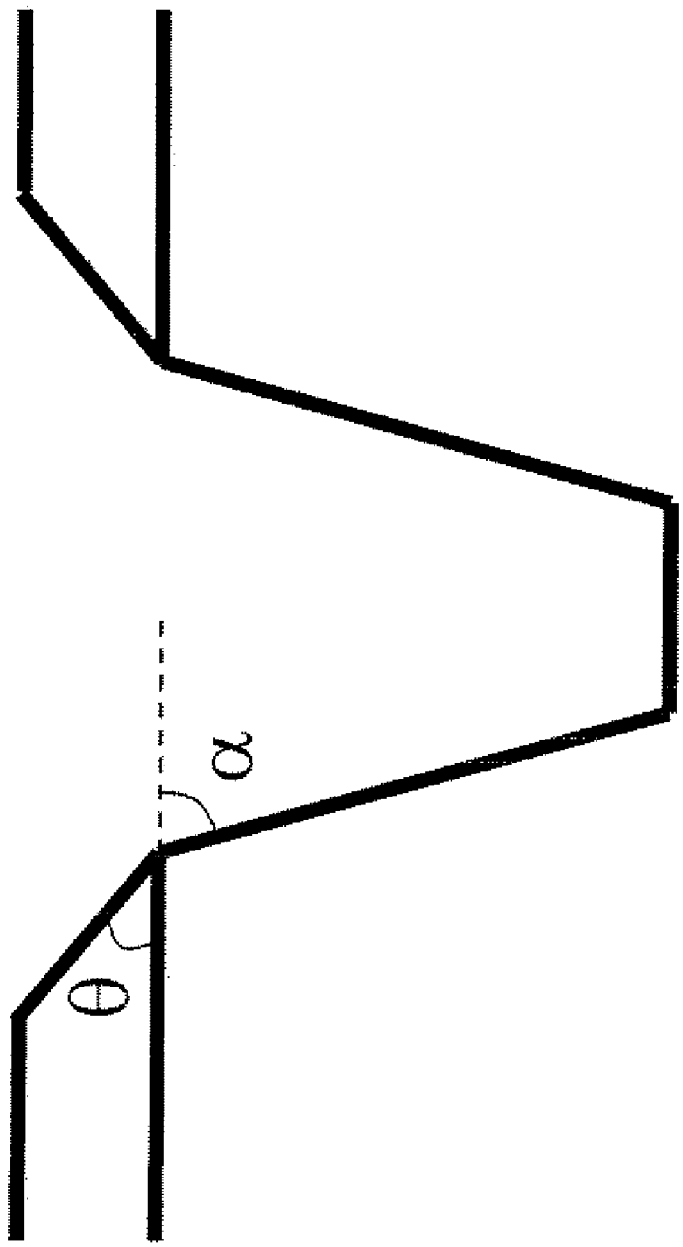

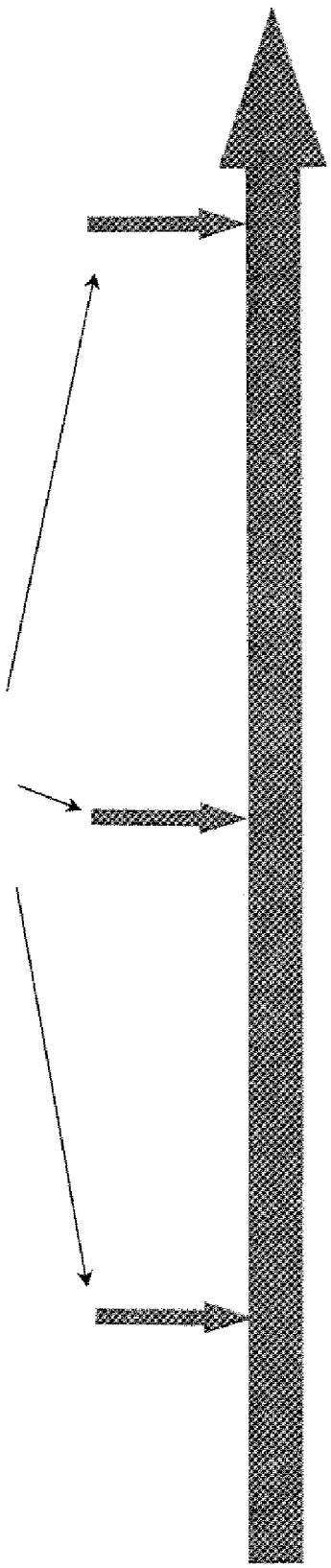

US 7,829,465 B2

METHOD FOR PLASMA ETCHING OF POSITIVELY SLOPED STRUCTURES

CROSS REFERENCES TO RELATED APPLICATIONS

This application claims priority from and is related to commonly owned U.S. Provisional Patent Application Ser. No. 60/836,483 filed Aug. 9, 2006, entitled: A Method and Apparatus for Plasma Etching of Positively Sloped Structures, this Provisional Patent Application incorporated by reference herein.

FIELD OF THE INVENTION

The present invention relates to the etching of deep trenches with a sidewall having a positive taper angle in a substrate.

BACKGROUND

The fabrication of 3-dimensional high aspect ratio structures in semiconductor wafers has been used extensively in making microelectronic devices. Of particular interest is the fabrication of deep structures with positively tapered profile, as shown in FIG. 1a, where the sidewall taper angle is denoted α. In practice, 3-dimensional silicon structures, such as trenches and vias, with a positive taper angle α of 50-80° are often required in both the front-end applications and back-end applications. For example, in the micro-electro-mechanical systems (MEMS), sloped silicon trenches can be used as micro-fluid channels in biochips and as optical fiber alignment devices in micro-mirrors; and silicon vias with positive tapers are used as ink jet nozzles. In the back-end applications, through-wafer vias with a positive taper are used in chip scale packaging (CSP) applications to make advanced microchips more compact and to enable better electrical performances.

In general, there are two primary requirements when manufacturing positively tapered structures, namely the precisely controlled sidewall profile and the relatively high etch rate. The sidewall profile is of particular concern in many applications. For example, in many applications, etching of sloped vias is often followed by physical vapor deposition (PVD) an/or chemical vapor deposition (CVD) to deposit a diffusion barrier and subsequently a metal seed layer, completely covering all the exposed surfaces. Then, the vias are filled with metallic materials in an electroplating process. Thus, a proper taper angle is crucial to ensure the quality of step coverage of the diffusion barrier layer and the metal seed layer, and subsequently the metal filling in the electroplating step. In this regard, the so-called "cusping" in the top portion of the etched structure is a problem one often encounters. When cusping occurs, the very top portion of the sidewall has an inward curvature, as shown in FIG. 1b. Even small cusping could degrade the step-coverage of the diffusion barrier layer and the metal seed layer and cause void formation in subsequent via filling with metals.

On the other hand, the requirement of a high etch rate comes from the concern over manufacturing throughputs. Trenches and vias are frequently required to have depths well over 100 μm. To ensure manufacturability, the fabrication processes must be capable of high etch rates in order to maintain reasonable throughputs. Another major process requirement in this aspect is the high etch selectivity to the mask materials. With the structure depth requirements, a low selectivity to the etch mask materials could have many adverse implications. For example, a very thick photo resist (PR) mask would be needed if the selectivity is too low, e.g., <10:1, and this could have many undesired complications. Hard masks generally have higher etch selectivity than the PR masks. However, putting down a layer of hard mask material and removing it afterwards are more complicated, when compared with using conventional PR masks.

Traditionally, wet KOH etching is used to etching deep sloped silicon structures. On silicon wafers with a (100) crystalline orientation, etched trenches and vias have a taper angle of 54.7 degrees. However, this technique has severe limitations as the taper angle is fixed. In addition, wet KOH etching requires special mask materials and has complications in chemical waste disposal and in residue contaminations. More importantly, wet KOH etching is often hard to be integrated into the state-of-art semiconductor production lines, which employ numerous processing steps under vacuum.

Over the years, techniques of fabricating sloped 3-dimensional semiconductor structures with plasma dry etching have been developed.

Westerman et al. (F. Clayton, R. J. Westerman, and D. Johnson, 2002 *GaAs MANTECH: International Conf. On GaAs Manufacturing Technology*, pp. 121-124) disclosed a technique of etching tapered GaAs vias with chlorine-based chemistries. With high radio frequency (RF) bias to promote PR mask recession, GaAs vias are etched at rates exceeding 6 μm/min in a $BCl_3/Cl_2$ plasma. However, etching a silicon structure in Cl-based chemistries is known for the slow rate and low etch selectivity to PR masks. In fact it is difficult to achieve etch rates of >1 μm/min when etching Si or Ge materials with a $BCl_3/Cl_2$ plasma.

Douglas, in U.S. Pat. No. 4,690,729 described a plasma method for etching deep trenches in silicon substrates with controlled sidewall profile. HCl gas is used as an etchant and silicon oxide is used as etch mask. Under reactive ion etching (RIE) plasma conditions, the oxide mask is sputtered during the course of the silicon etching and re-deposited onto the sidewalls of the etched trenches, providing sidewall protection. The $SiO_x$ deposited on the sidewall inhibits etching at the bottom of the trench near the sidewall. As a result, the gradual buildup of $SiO_x$ on the sidewall and the progress of silicon etching in the vertical direction produce a positively sloped trench sidewall without "grooving" the bottom of the trench. While this method causes little mask undercut, the etch rate is slow and the achievable depth of the silicon trench is limited.

In recent years, there have been intensive efforts in etching sloped silicon structures with F-containing chemistries. For example, Vogel et al. taught in U.S. Pat. No. 4,324,611 a method for tailoring a reagent gas mixture to achieve a high etch rate, high etch selectivity and low breakdown of PR mask in high-density plasma. The disclosed reagent gas mixture includes a primary etchant gas consisting of carbon-fluoride, and a secondary gas containing hydrogen to control the etch selectivity. A tertiary gas containing helium may be also included to prevent the breakdown of the PR mask. In one embodiment for plasma etching silicon dioxide or silicon nitride overlying silicon, the primary gas is $C_2F_6$ and the secondary gas is $CHF_3$. However, such etch processes still cannot produce etch rates exceeding 2-3 μm/min because the heavy deposition component of the process reduces etching efficiency significantly.

In U.S. Pat. No. 5,501,893, Laermer et al. disclosed a method in etching silicon at much higher silicon etch rates using F-containing chemistries. The so-called "Bosch process" employs alternating etching and polymerizing steps. Typically, in an etching step, $SF_6$ gas is used; in a polymerizing step, $C_4F_8$ gas is used to facilitate polymeric passivation on all exposed surfaces. In an etching step, RF bias facilitates preferential removal of polymeric passivation on the bottom surface, and $SF_6$ facilitates spontaneous and isotropic etching of silicon. The Bosch processes alternatingly repeats between the etching step and the polymerizing step.

The Bosch processes are advantageous in fabricating anisotropic recess structures with vertical sidewall profiles. However, they are not very successful in fabricating structures with a sidewall taper angle of less than 85 to 88 degrees. In order to achieve a positively tapered profile, the balance between etching and polymerizing needs to shift to the polymeric passivation side. In practice, either a high deposition rate or a less effective etching is needed. This can be accomplished by increasing the flow rate of deposition gas, increasing the deposition step time, and/or reducing the RF bias during the etching step. While such approaches could have limited success in producing a sidewall taper angle of slightly less than 90 degrees, there is an increase in the risk of grass formation in the etched structures together with a lower etching rate.

M. Rattner et al. in U.S. Pat. No. 6,849,554 disclosed a method of etching deep trenches with a positive tapered sidewall angle of less than about 88 degrees. The method employs a series of successive etching steps polymer passivation steps and clean-up steps. Alternatively, in one embodiment, the etching step and the polymer deposition step are carried out simultaneously. The etching steps are carried out at a chamber pressure ranging from about 30 mTorr to about 150 mTorr, to provide a lateral undercut, while at the same time etching vertically downward beneath the mask. When a process employs alternatingly repeating etching steps and deposition steps, both steps are carried out at a chamber pressure ranging from about 30 mTorr to about 150 mTorr. From the examples disclosed in the patent, it is suggested that chamber pressure is the main process control for adjusting taper angles by facilitating more isotropic etching at high chamber pressures. Rattner's method does not address the common cusping problem to which the root cause is the isotropic silicon etching.

R. Nagarajan in U.S. Patent Application 20040178171 disclosed another method of etching positively tapered silicon trenches. Nagarajan's technique employs a repetitive sequence of "passivation ($C_4F_8$)-isotropic etching ($SF_6$)-mask recession ($O_2$)", as shown in FIG. 1c. One of the key requirements for this method is that PR mask must have a sloped edge around the periphery of the mask opening. After the first "passivation-isotropic etching-mask recession" cycle, a portion of silicon trench is etched. Meanwhile, the PR mask is also etched and recessed at its edge, thus the mask opening being enlarged. In the next cycle, a new portion of silicon material is etched away, extending the etching depth. The newly etched portion has a lateral dimension defined by the preceding portion, while the preceding portion is further etched laterally so that the lateral dimension is increased. In the end, a staircase-like configuration is created in the trench sidewall, making the etched trench positively sloped.

Yet, this method has its limitations. Obviously, it cannot be readily applied to cases in which hard oxides masks are used. Also, there exists a relationship among the three parameters, namely the sidewall taper angle α, the mask slope angle θ, and the etch selectivity to mask S, as illustrated in the following Equation (see FIG. 2a):

$$\tan \alpha = S \cdot \tan \theta$$

In order to have a small sidewall taper angle α, the mask slope angle θ needs to be small, which is often hard to achieve by hard baking the PR at high temperatures. If these two angles are fixed, the silicon etch selectivity to mask is also fixed. For example, if one wants to achieve a sidewall taper angle of 60 degrees with a PR mask slope angle of 30 degrees, the silicon etching selectivity needs to be 3:1. In other words, the required PR mask needs to have a thickness over 30 μm if the final etch depth is 100 μm. For deep sloped silicon structures, such limitations could be too severe. In practice, this method is more suitable for applications in which the required sidewall taper angle is not too small, for example 80 degrees (see FIG. 2b), or the slower etch rate and etch selectivity are more acceptable.

Weston et al. (D. Weston, W. J. Dauksher, D. Rhine and T. Smekal, *Electrochemical Society Proceedings* vol. 2002-17, pp. 227-238) reported a study in which positively tapered Si structures were etched using a $SF_6/C_4F_8/O_2$ gas mixture. The effects of $SF_6/C_4F_8$ gas ratio, RF bias power and plasma chamber pressure on sidewall smoothness and taper angle were investigated. However, the cusping on the etched structures was persistent. A representative example of cusping using a $SF_6/C_4F_8/O_2$ gas mixture is shown in FIG. 2c.

C. S. Gormley in U.S. Pat. No. 6,818,564 disclosed that etching tapered Si pores with $SF_6$ gas only. No details on the sidewall profile were revealed, but it is reasonable to believe that the sidewall profile should have more severe cusping than what is shown in FIG. 2c. It is well known that silicon etching in $SF_6$ plasma is highly isotropic.

Based on the limitations of the prior art, there is a need for a method which can be used to etch positively tapered deep silicon structures at high etch rate, high selectivity to etch mask materials with precise sidewall profile control.

Nothing in the prior art provides the benefits attendant with the present invention.

Therefore, it is an object of the present invention to provide an improvement which overcomes the inadequacies of the prior art devices and which is a significant contribution to the advancement to the processing of MEMS.

Another object of the present invention is to provide a method of etching trenches in a substrate comprising placing said substrate on a support member in a vacuum chamber; introducing at least one polymer containing gas into said vacuum chamber; igniting a plasma from said polymer containing gas; depositing a polymer on said substrate using said plasma of said polymer containing gas; introducing an etchant containing gas, a polymer containing gas and a scavenger containing gas into said vacuum chamber; igniting a plasma from said etchant containing gas, said polymer containing gas and said scavenger containing gas; etching said substrate using said plasma of said etchant containing gas, said polymer containing gas and said scavenger containing gas; and alternatingly repeating the deposition step and the etching step until a predetermined trench depth and a predetermined sidewall angle are achieved.

Yet another object of the present invention is to provide a method of etching features in a substrate comprising: placing said substrate on a support member in a vacuum chamber; introducing at least one polymer containing gas into a vacuum chamber; igniting a plasma from said polymer containing gas; depositing a polymer on said substrate using said plasma of said polymer containing gas; introducing an etchant containing gas and a polymer containing gas into said vacuum chamber; igniting a plasma from said etchant containing gas and said polymer containing gas; etching said substrate using said plasma of said etchant containing gas and said polymer containing gas; and alternatingly repeating the deposition step and the etching step until a predetermined trench depth and a predetermined sidewall angle are achieved.

Still yet another object of the present invention is to provide a method of etching features in a substrate comprising: placing said substrate on a support member in a vacuum chamber; introducing at least one polymer containing gas into a vacuum chamber; igniting a plasma from said polymer containing gas; depositing a polymer on said substrate using said plasma of said polymer containing gas, said deposition of said polymer having a process on-time of less than about two seconds; introducing an etchant containing gas into said vacuum chamber; igniting a plasma from said etchant containing gas; etching said substrate using said plasma of said etchant containing gas; and alternatingly repeating the deposition step and the etching step until a predetermined trench depth and a predetermined sidewall angle are achieved.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention provides etch processes which are capable of generating a sidewall taper angle ranging from about 45 to 85 degrees by using short passivation pulses. The main etch process uses a gas mixture containing at least one etchant gas, one polymer passivation gas and one polymer scavenger gas to generate the positively sloped sidewall profile. The short passivation pulse contains at least one polymer passivation gas and is intermittently inserted into the main etch processes. With the non-uniform polymer passivation on the exposed sidewall surface, etching at the very top portion of the structure takes place for an additional period of time, thus correcting the cusping in the etched structures. By controlling the main etch process and the characteristics of the modulating passivation pulse, precise control over the sloped sidewall profile is obtained.

A feature of the present invention is to provide a method of etching features in a substrate. The substrate can be a semiconductor substrate such as Silicon, Germanium, Gallium Arsenide or any known semiconductor, including compound semiconductors e.g. Group II and Group VI compounds and Group III and Group V compounds. The substrate may also be a conductor or a dielectric material such as glass or quartz. The method comprising the steps of placing the substrate on a substrate support in a vacuum chamber. A high density plasma can be generated using an RF energy source. The substrate support can be a lower electrode to which is connected another RF energy source which provides a bias voltage to the substrate. An alternatingly and repeating process is performed on the substrate until a predetermined trench depth and a predetermined sidewall angle are achieved. One part of the process is a deposition step which is carried out by introducing at least one polymer containing gas into the vacuum chamber. The polymer containing gas can be selected from the group consisting of fluorocarbon containing gases, hydrocarbon containing gases and combinations thereof. In a preferred embodiment, the polymer containing gas can be selected from the group consisting of $C_4F_8$, $CH_2F_2$, $CHF_3$ and combinations thereof. A plasma is ignited from the polymer containing gas which is then used to deposit a polymer on the substrate. In a preferred embodiment, a process on-time for the deposition step can be less than about two seconds. The other part of the alternatingly and repeating process is an etching step which is carried out by introducing an etchant containing gas, a polymer containing gas and a scavenger containing gas into the vacuum chamber. The etchant containing gas can be selected from the group consisting of $SF_6$, $CF_4$, $NF_3$ and combinations thereof. The scavenger containing gas can be an oxygen containing gas. In a preferred embodiment, the oxygen containing gas can be selected from the group consisting of $O_2$, $CO_2$ and combinations thereof. A plasma is ignited from the etchant containing gas, the polymer containing gas and the scavenger containing gas which is then used to etch the substrate. During the etch step, the support member can be maintained at temperatures ranging from about minus 40 degrees C. to about 20 degrees C. Upon completion of the etch process, the substrate is removed from the vacuum chamber. During the alternatingly and repeating process, one or more process parameters can vary over time within the etching step or the deposition step. In addition, during the alternatingly and repeating process, one or more process parameters can vary over time from etching step to etching step or from deposition step to deposition step.

Another feature of the present invention is to provide a method of etching features in a substrate. The substrate can be a semiconductor substrate such as Silicon, Germanium, Gallium Arsenide or any known semiconductor, including compound semiconductors e.g., Group II and Group VI compounds and Group III and Group V compounds. The substrate may also be a conductor or a dielectric material such as glass or quartz. The method comprising the steps of placing the substrate on a substrate support in a vacuum chamber. A high density plasma can be generated using an RF energy source. The substrate support can be a lower electrode to which is connected another RF energy source which provides a bias voltage to the substrate. An alternatingly and repeating process is performed on the substrate until a predetermined trench depth and a predetermined sidewall angle are achieved. One part of the process is a deposition step which is carried out by introducing at least one polymer containing gas into the vacuum chamber. The polymer containing gas can be selected from the group consisting of fluorocarbon containing gases, hydrocarbon containing gases and combinations thereof. In a preferred embodiment, the polymer containing gas can be selected from the group consisting of $C_4F_8$, $CH_2F_2$, $CHF_3$ and combinations thereof. A plasma is ignited from the polymer containing gas which is then used to deposit a polymer on the substrate. In a preferred embodiment, a process on-time for the deposition step can be less than about two seconds. The other part of the alternatingly and repeating process is an etching step which is carried out by introducing an etchant containing gas and a polymer containing gas into the vacuum chamber. The etchant containing gas can be selected from the group consisting of $SF_6$, $CF_4$, $NF_3$ and combinations thereof. A plasma is ignited from the etchant containing gas and the polymer containing gas which is then used to etch the substrate. During the etch step, the support member can be maintained at temperatures ranging from about minus 40 degrees C. to about 20 degrees C. Upon completion of the etch process, the substrate is removed from the vacuum chamber. During the alternatingly and repeating process, one or more process parameters can vary over time within the etching step or the deposition step. In addition, during the alternatingly and repeating process, one or more process parameters can vary over time from etching step to etching step or from deposition step to deposition step.

Yet another feature of the present invention is to provide a method of etching features in a substrate. The substrate can be a semiconductor substrate such as Silicon, Germanium, Gallium Arsenide or any known semiconductor, including compound semiconductors e.g., Group II and Group VI compounds and Group III and Group V compounds. The substrate may also be a conductor or a dielectric material such as glass or quartz. The method comprising the steps of placing the substrate on a substrate support in a vacuum chamber. A high density plasma can be generated using an RF energy source. The substrate support can be a lower electrode to which is connected another RF energy source which provides a bias voltage to the substrate. An alternatingly and repeating process is performed on the substrate until a predetermined trench depth and a predetermined sidewall angle are achieved. One part of the process is a deposition step which is carried out by introducing at least one polymer containing gas into the vacuum chamber. The polymer containing gas can be selected from the group consisting of fluorocarbon containing gases, hydrocarbon containing gases and combinations thereof. In a preferred embodiment, the polymer containing gas can be selected from the group consisting of $C_4F_8$, $CH_2F_2$, $CHF_3$ and combinations thereof. A plasma is ignited from the polymer containing gas which is then used to deposit a polymer on the substrate. The deposition step has a process on-time of less than about two seconds. The other part of the alternatingly and repeating process is an etching step which is carried out by introducing an etchant containing gas into the vacuum chamber. The etchant containing gas can be selected from the group consisting of $SF_6$, $CF_4$, $NF_3$ and combinations thereof. A plasma is ignited from the etchant containing gas which is then used to etch the substrate. In a preferred embodiment, a scavenger containing gas is introduced into the vacuum chamber and a plasma is ignited which is then used to etch the substrate. The scavenger containing gas can be an oxygen containing gas. In a preferred embodiment, the oxygen containing gas can be selected from the group consisting of $O_2$, $CO_2$ and combinations thereof. During the etch step, the support member can be maintained at temperatures ranging from about minus 40 degrees C. to about 20 degrees C. Upon completion of the etch process, the substrate is removed from the vacuum chamber. During the alternatingly and repeating process, one or more process parameters can vary over time within the etching step or the deposition step. In addition, during the alternatingly and repeating process, one or more process parameters can vary over time from etching step to etching step or from deposition step to deposition step.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 2a is a schematic view of a positively tapered profile showing the relationship among the sidewall taper angle $\alpha$, the mask slope angle $\theta$ and the etch selectivity to mask S;

FIG. 3 shows is a schematic view of the process scheme disclosed in the present invention;

Similar reference characters refer to similar parts throughout the several views of the drawings.

DETAILED DESCRIPTION OF THE INVENTION

Figure 1B:
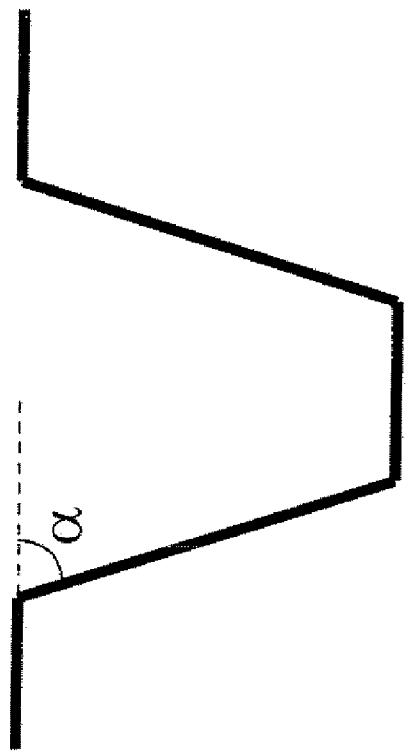
FIG. 1b is a schematic view of a prior art positively tapered profile in etching a deep structure in a substrate with cusping in the top portion of the etched structure.
Figure 1A:
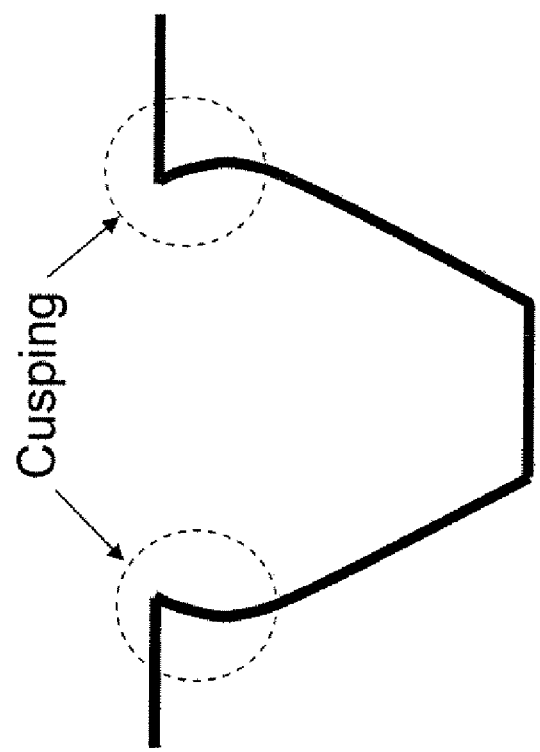
FIG. 1a is a schematic view of a positively tapered profile in etching a deep structure in a substrate.
Figure 1C:
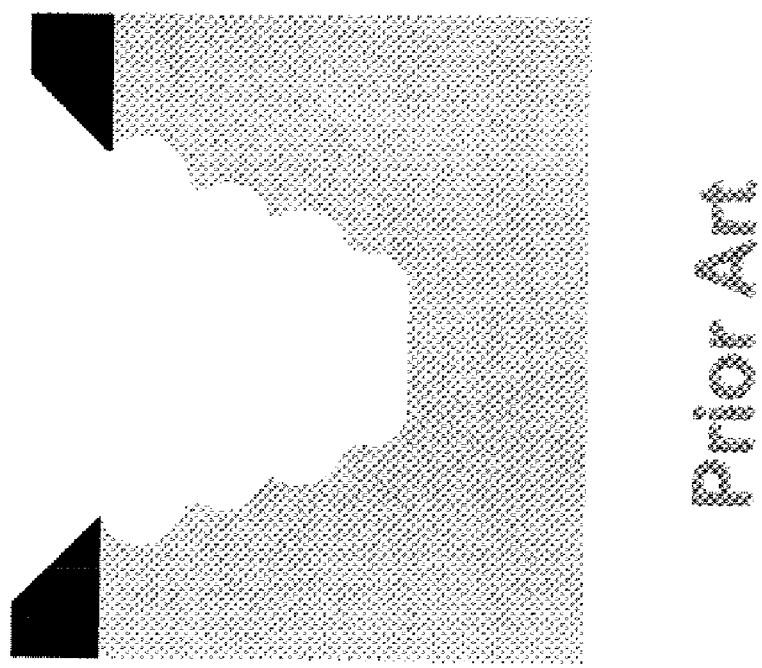
FIG. 1c is a schematic view of a prior art positively tapered profile in etching a deep structure in a substrate with a staircase-like configuration created in the trench sidewall.
Figure 2B:
FIG. 2b is an SEM image showing is a prior art positively tapered profile in etching a deep structure in a substrate.
Figure 2C:
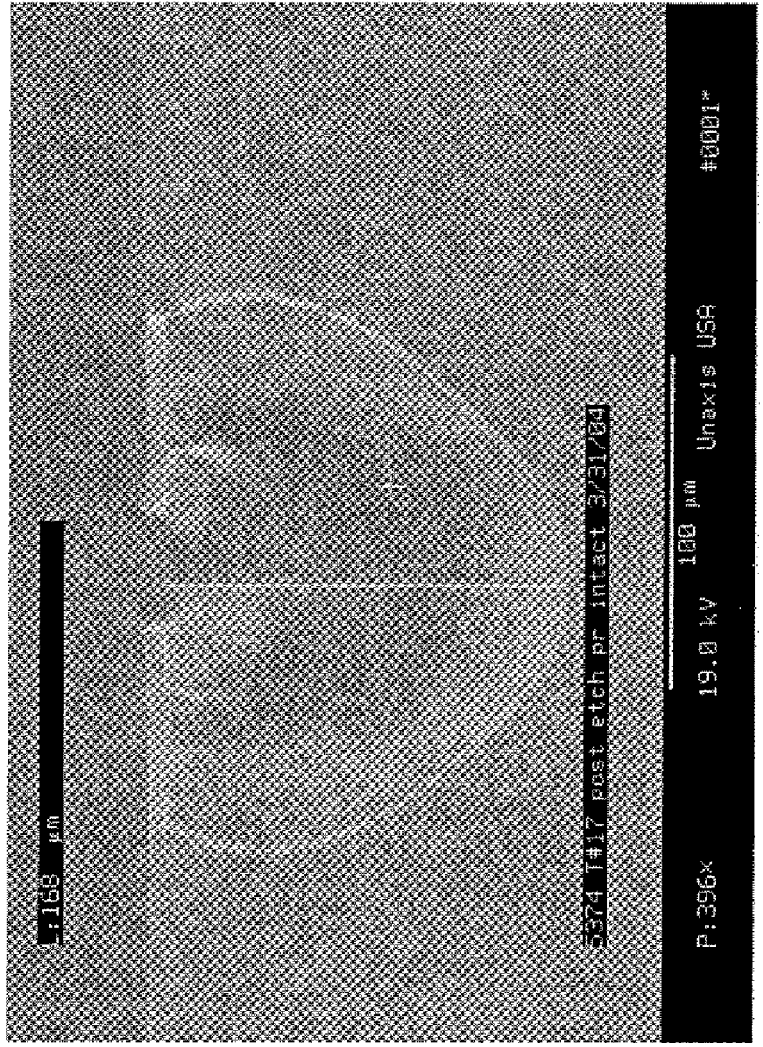
FIG. 2c is an SEM image showing a prior art positively tapered profile in etching a deep structure in a substrate with cusping in the top portion of the etched structure.

The present invention provides a method of etching features in a substrate. The method disclosed uses an alternatingly and repeating deposition and etch process to achieve a predetermined trench depth and a predetermined sidewall angle while preventing cusping in the etched trench.

FIG. 3 depicts the process scheme disclosed in the present invention. The main etch process is the plasma etching using a gas mixture, preferably F-based chemistries containing at least one etchant gas, to generate the positively sloped etch profile. The main plasma etching process is modulated by short polymer passivation pulses, which contain at least one polymer forming gas. The polymer passivation pulse is inserted into the main etch process intermittently.

In a preferred embodiment, three gas components should be present in the main plasma etch process: (a) a silicon etchant gas, such as $SF_6$ and $NF_3$, (b) a polymer passivation gas, such as $C_4F_8$ and $CHF_3$, and (c) a polymer scavenger gas, such as $O_2$, $CO_2$, or other oxygen containing gases. The scavenger gas is believed to improve the via surface morphology and provide a means to adjust the slope of the etched via. In other embodiments, the polymer scavenger gas can be left out in the main plasma etch process. During the main etching process steps, the positively sloped etch profile is generated with a sidewall taper angle in the range of about 45 to 85 degrees. In particular, the desired taper angle is generated by adjusting process parameters, such as the gas ratio in the gas mixture, the RF bias voltage and the wafer platen temperature. In preferred embodiments, the main etch process can last for about 10 seconds or longer before it is interrupted by the short polymer passivation pulse and the wafer platen temperature is maintained at temperatures ranging from about minus 40 degrees C. to about 20 degrees C. through a heat exchanger.

The short polymer passivation pulse contains at least one polymer forming gas, such as fluorocarbon gases ($C_4F_8$, $C_2F_6$, $C_x F_y$, $CHF_3$, $C_x H_y F_z$, etc.) and hydrocarbon gases ($CH_4$, $C_2H_4$, $C_3H_6$, $C_4H_8$, $C_2H_2$, $C_x H_y$ etc.). It is intended for non-uniform polymer passivation on the exposed surface of the etched structure. In other words, polymer passivation is preferred only at the bottom surface and at the sidewall surface close to the bottom. At the top sidewall surface, very little or no polymer should be formed. The polymer passivation pulse is intrinsically brief in its time duration, typically 1 to 2 seconds only. After the passivation pulse, the main etch process resumes.

In some embodiments, the efficiency of the polymer passivation during the short passivation pulse is adjusted through the addition of etchant gas, such as $SF_6$, and the cooling of the wafer by the platen, maintained preferably in the range of about minus 40 degrees C. to about 20 degrees C. A plurality of passivation pulses can be inserted into the main etch process in the beginning of the etch process sequence, in the end of the etch process sequence, or intermittently throughout the etch process sequence. The purpose of the intermittent insertions of the passivation pulse is to temporarily slow down the etching in the vertical direction, while allowing etching in the lateral direction at the top portion of the structure to proceed for a short period time at the same time.

The present invention has been demonstrated in practice on the Oerlikon Versaline plasma etcher. The plasma etcher is equipped with an inductively coupled plasma (ICP) source operated at 2 MHz and an independent RF bias operated at 100 kHz. The etching of sloped silicon structures is carried out on 6-inch diameter and 8-inch diameter silicon wafers. The wafers are placed on top of the cathode, either mechanically clamped or chucked with an electrostatic chuck. The selected processing parameters are listed in Table 1 below.

TABLE 1

A typical set of processing parameters for sloped silicon etching.

| | Main Etch Step | Brief Deposition Step |
| --- | --- | --- |
| Gases (sccm) | $SF_6$(500)/$C_4F_8$(80)/ $O_2$(20)/Ar(30) | $C_4F_8$(80)/Ar(30) |
| Pressure (mTorr) | 70 | 20 |
| ICP Power (W) | 2500 | 2500 |
| Bias Voltage (V) | 120 | 0 |
| Cathode Temp (° C.) | −10 | −10 |
| Step times (s) | 10-14 | 1.2 |

Figure 4A:
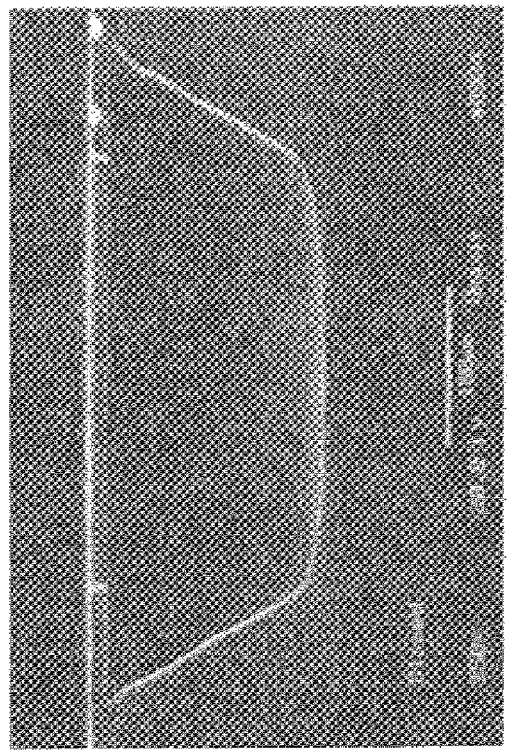
FIG. 4a is an SEM image of the cross section of a sloped silicon trench etched into a 6-inch diameter wafer using the present invention.

FIG. 4a shows the scanning electron microscopic (SEM) image of the cross section of a sloped silicon trench etched into a 6-inch diameter wafer. The sidewall taper angle is measured at 60 degrees. The etching depth is about 140 μm after 20 minutes of etching, indicating that an etch rate of 7 μm/min is achieved. As shown, there is no cusping in the etched sidewall. At the top of the etched trench is the PR mask, which can be removed easily after the necessary processing steps, either in a solvent solution or with plasma ashing. This etching process has a silicon etch selectivity to the PR mask of 220:1.

Figure 4B:
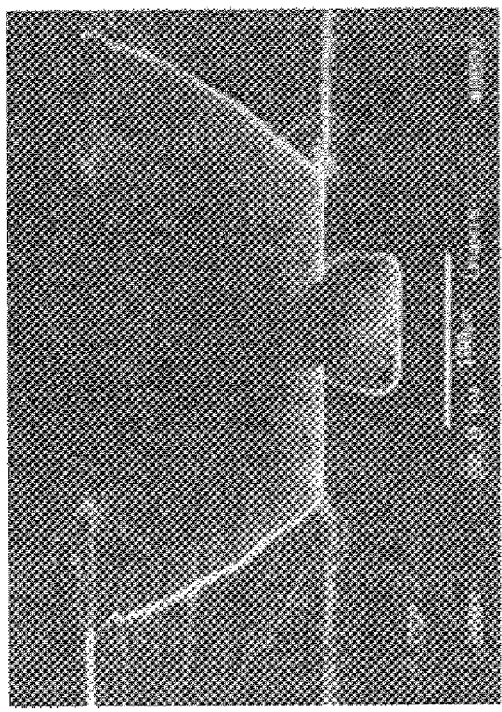
FIG. 4b is an SEM image of the cross section of a sloped silicon trench etched into an 8-inch diameter wafer using the present invention.

FIG. 4b shows the cross-sectional SEM image of a sloped silicon trench etched into an 8-inch diameter wafer. The silicon device layer, which has a thickness of 130 μm, is on top of a layer of epoxy. A pre-formed channel in the epoxy layer is exposed after the plasma etching, as shown in the image. In this case, the sidewall taper angle is measured at 62 degrees and the etching rate is 6.5 μm/min. Once again, there is no cusping in the etched trench.

The examples shown in FIGS. 4a and 4b are representative using the methods disclosed in the present invention. The processing parameters are only optimized to the specific requirements in the above examples. Yet a skilled person in the field should be able adjust the processing parameters to apply for other process requirements. i.e., different sidewall taper angles and etching rates. The present invention can be implemented on standard silicon etching tools, with little or no changes to the hardware, such as RF systems and gas configurations.

Figure 5A:
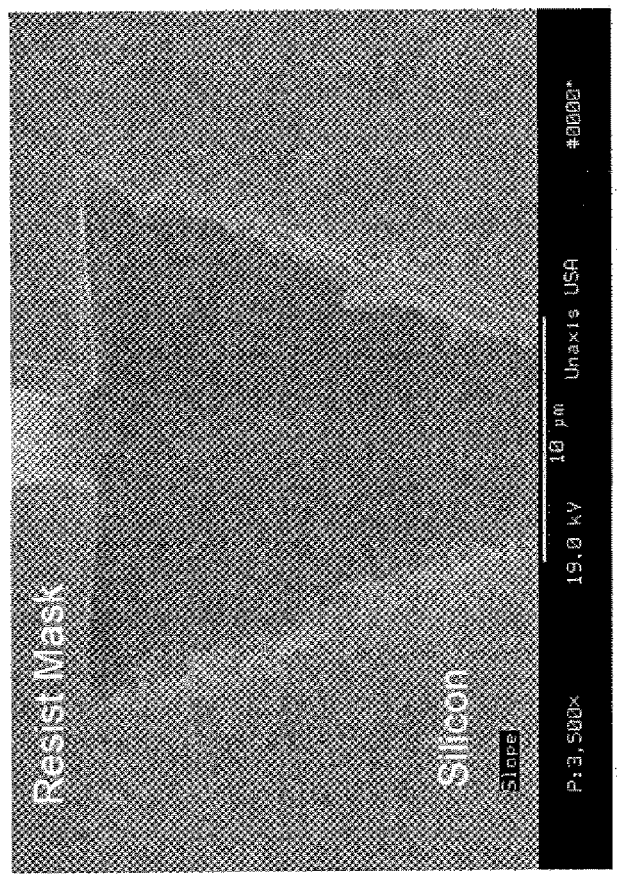
FIG. 5a is an SEM image of the cross section of a sloped silicon trench showing that the polymer passivation is not uniform at the sidewall surface.
Figure 5B:
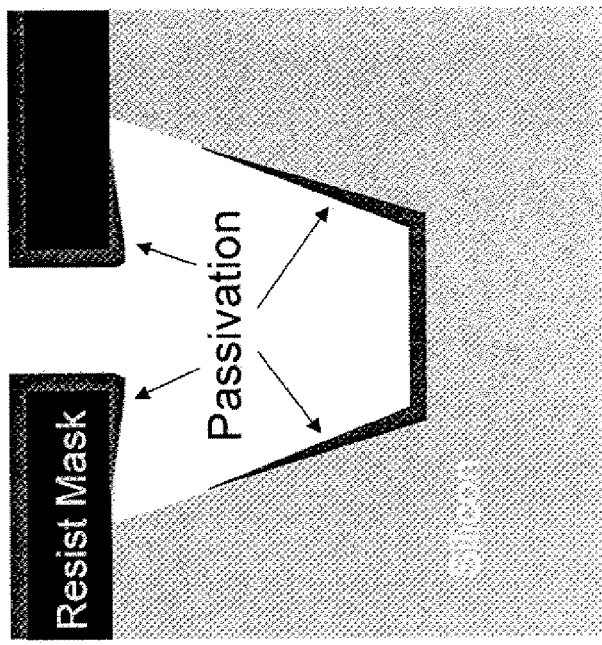
FIG. 5b is a schematic view of the cross section of a sloped silicon trench showing that the polymer passivation is not uniform at the sidewall surface.

This new method takes advantage of a unique property of polymer passivation. Even though polymer passivation using fluorocarbon gases such as $C_4F_8$ does have relatively conformal step coverage, it is indeed affected by the geometry of an exposed surface. FIG. 5a illustrates such a case in an experiment. Prior to the polymer passivation experiment, positively tapered silicon structures are etched and no removal of the PR mask is performed. For illustration purposes, the polymer passivation process runs for an extended period of time, about 5 minutes, to deposit a thick layer of polymer. The nominal polymer passivation rate is about 50 Å/s. In this case, the ($CF_2$)— radicals are transported to the sidewall surface through the narrow mask opening. As shown in FIG. 5a, the polymer passivation is not uniform at the sidewall surface. On the portion of the sidewall surface most shadowed by the PR mask, there is no polymer passivation. In the areas further don along the sidewall and more exposed in the line of sight through the mask opening, more polymer passivation is observed. FIG. 5b illustrates the polymer passivation schematically. With the overhanging mask, polymer passivation on the sloped silicon sidewall is non-uniform. At the surface, which is more shadowed by the overhanging mask, there is much less polymer passivation.

Figure 6A:
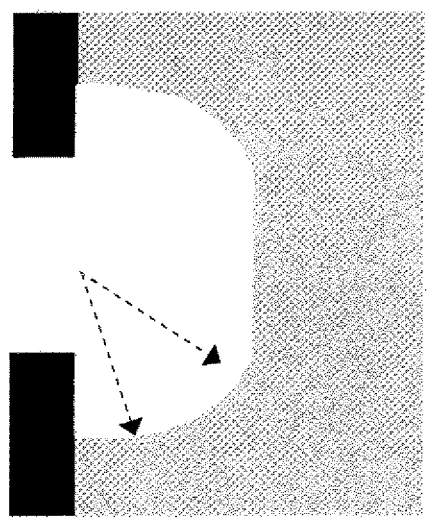
FIG. 6a is a schematic view of the undercut that occurs underneath the mask during a sloped silicon trench etch using an anisotropic etch.
Figure 6B:
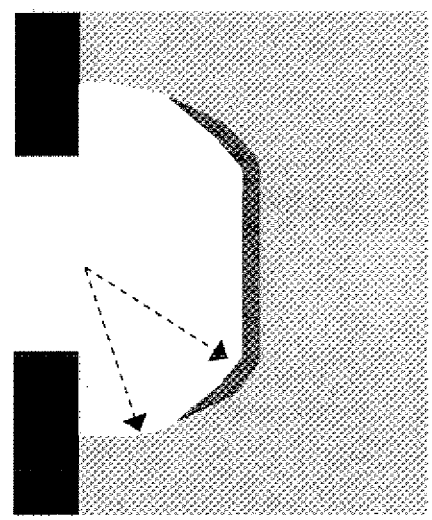
FIG. 6b is a schematic view of the undercut that occurs underneath the mask during a sloped silicon trench etch while using a deposition pulse during the etch step.
Figure 6C:
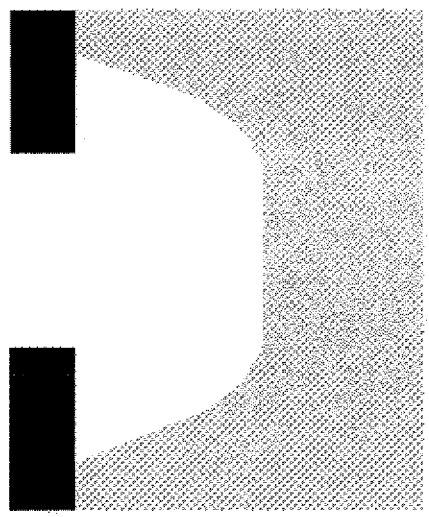
FIG. 6c is a schematic view of the undercut that occurs underneath the mask during a sloped silicon trench etch using the method of the present invention.

The mechanism of controlling sloped sidewall profile is explained in FIGS. 6a to 6c. When a silicon substrate is etched with a gas mixture with $SF_6$ gas and $C_4F_8$ gas ratio exceeding certain threshold, e.g., >5:1, etching takes place and undercut occurs underneath the mask (see FIG. 6a). Etching in the vertical direction is enhanced by ion bombardment, while etching in the lateral direction is more chemical-driven and more isotropic. When a very short passivation pulse punctuates the etch process, a layer of polymer is deposited at the surface. However, this thin layer is not uniform on the sidewall surface (see FIG. 6b). At the surface exposed from the line of sight through the mask opening, e.g., the bottom surface and the surface close to the bottom, there is more polymer passivation at the surface directly underneath the mask and the thickness of the polymer layer is progressively reduced. Given the short passivation pulse, it is reasonable to believe that at the very top of the sidewall surface, which is most shadowed by the mask, no polymer is formed at all. On the surface in the middle potion of the sidewall surface, the coverage by the polymer layer may not be continuous, due to the very short passivation time (about 1 second). When the etch process resumes after the passivation pulse (see FIG. 6c), silicon etching at the top portion starts right away due to the lack of inhibiting by the polymer. This will expand the lateral dimension at the very top portion of the structure. Whereas, the silicon etching in the lower portion of the structure is temporarily delayed. Etching of silicon will not start until the polymer layer deposited at the surface is cleared by ion bombardment. This essentially gives the lateral etching at the top portion of the structure a "head start." In this way, the cusping created in the previous etching step is corrected.

One of the advantages of using the short passivation pulse is the flexibility of precise control over the curvature of the top portion of the etched structure. The main etch process uses the mixed gas to generate the angle of the etched slope, while the short passivation pulse serves as an independent leverage in correcting the taper angle at the very top portion. In essence, the extent of cusping correction is achieved through etching the very top portion for a longer time, by an amount of differential in the "head start" period. By adjusting the parameters used in the passivation pulse, such as gas flow rate, pressure, passivation time and the number of pulses, the time differential can be adjusted. As such, the sidewall of the structure can have a relatively inward curvature (i.e., reduced cusping), a straight line profile (no curvature), or an outward curvature.

Of particular interest is the timing aspect of the passivation pulse modulation. Since the purpose of the insertion of the passivation pulse is to compensate the cusping at the top portion during the main etch process, a plurality of passivation pulses can be inserted at any proper moment. For example, the pulses can be inserted at the beginning of the etch process sequence, at the end of the etch process sequence, both at the beginning and at the end, or intermittently throughout the etch process sequence. A reasonably skilled person in the field can choose the optimal manner of modulation based on process requirements. For example, the ratio of etch step time to deposition step time can be adjusted progressively using a predetermined algorithm as process proceeds, known to skilled persons as "morphing." Other processing parameters, such as gas flow rates, chamber pressure, RF bias voltage, wafer platen temperature, etc. can also be changed to achieve optimal processing results.

Another advantage of the method of the present invention is that it does not place specific requirements on the mask materials. Since mask enlarging or recessing is not involved, either hard oxide masks or regular PR masks can be used. Also, since the main silicon etching process does not heavily rely on ion bombardment, and passivation on the mask surface is available, the etching selectivity to mask materials is high. For example, when a PR mask is used, etch selectivity of 100:1 or more can be readily achieved.

Figure 7:
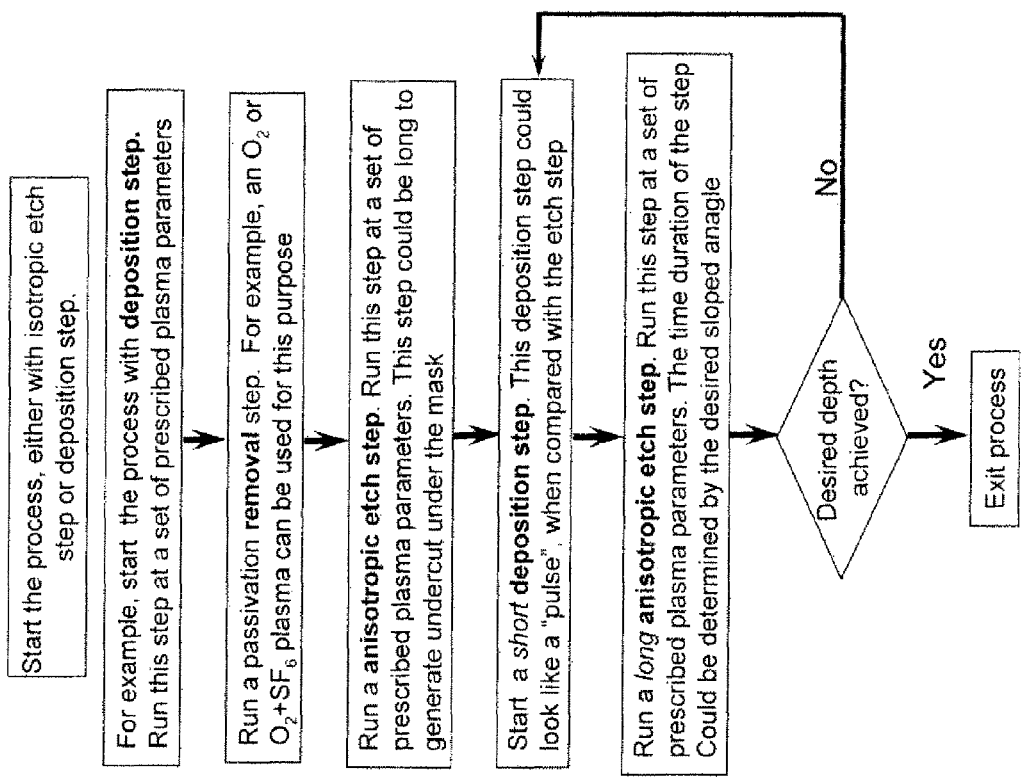
FIG. 7 is a block diagram of a plasma etching process using the instance when the modulation by passivation pulse is implemented throughout the main etch sequence as an example.

In FIG. 7, the block diagram of a plasma etching process is exhibited, using the instance when the modulation by passivation pulse is implemented throughout the main etch sequence as an example. The process starts with a short polymer passivation step. The passivation step is then followed by a polymer removal step. In a preferred embodiment, an $O_2$ plasma or an $O_2$ plus $SF_6$ plasma is used with proper RF bias voltage. If the $SF_6$ gas is used in the polymer passivation removal step, another benefit can be gained, namely the initial mask undercut can be created. The main etch process starts next, with prescribed processing parameters. This process can last about 10 seconds or longer to generate the first segment of the sloped structure. Then, the etch process is stopped and a short passivation pulse is inserted. In a preferred embodiment, this deposition step needs to be in the range of about 0.5 to 2 seconds. Next, the main etch process is resumed. The etch process can last for prescribed period of time before it is modulated by another short passivation pulse. Such sequences are repeated until the desired etch depth is reached or other processing requirements are met.

Although in the present invention only the etching of silicon substrates is disclosed, the method should be applicable to etching positively tapered structures in other semiconductor materials, such as germanium (Ge) substrates. In addition, with proper changes in chemistries, etching positively tapered structures in other materials, such as glasses and polyimide, can be also carried out using the method disclosed in the present invention.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

We claim:

1. A method of etching features in a substrate comprising:
    placing said substrate on a support member in a vacuum chamber;
    introducing at least one polymer containing gas into said vacuum chamber;
    igniting a plasma from said polymer containing gas;
    depositing a polymer on said substrate using said plasma of said polymer containing gas;
    pulsing said depositing of said polymer, said pulsing having a process on-time of less than about two seconds;
    repeating said pulsing of said depositing of said polymer;
    introducing an etchant containing gas, a polymer containing gas and a scavenger containing gas into said vacuum chamber;
    igniting a plasma from said etchant containing gas, said polymer containing gas and said scavenger containing gas;
    etching said substrate using said plasma of said etchant containing gas, said polymer containing gas and said scavenger containing gas; and
    adjusting parameters of the deposition step and adjusting parameters of the etching step until a predetermined trench depth and a predetermined sidewall angle are achieved.

2. The method according to claim 1 wherein said substrate is silicon.

3. The method according to claim 1 wherein said substrate is germanium.

4. The method according to claim 1 wherein said polymer containing gas is selected from the group consisting of fluorocarbon containing gases, hydrocarbon containing gases and combinations thereof.

5. The method according to claim 1 wherein said polymer containing gas is selected from the group consisting of $C_4F_8$, $CH_2F_2$, $CHF_3$ and combinations thereof.

6. The method according to claim 1 wherein said etchant containing gas is selected from the group consisting of $SF_6$, $CF_4$, $NF_3$ and combinations thereof.

7. The method according to claim 1 wherein said scavenger containing gas is an oxygen containing gas.

8. The method according to claim 7 wherein said oxygen containing gas is selected from the group consisting of $O_2$, $CO_2$ and combinations thereof.

9. The method according to claim 1 wherein said support member is maintained at temperatures ranging from about minus 40 degrees C. to about 20 degrees C. during the etch step.

10. A method of etching features in a substrate comprising:
placing said substrate on a support member in a vacuum chamber;
introducing at least one polymer containing gas into a vacuum chamber;
igniting a plasma from said polymer containing gas;
depositing a polymer on said substrate using said plasma of said polymer containing gas;
pulsing said depositing of said polymer, said pulsing having a process on-time of less than about two seconds;
repeating said pulsing of said depositing of said polymer;
introducing an etchant containing gas and a polymer containing gas into said vacuum chamber;
igniting a plasma from said etchant containing gas and said polymer containing gas;
etching said substrate using said plasma of said etchant containing gas and said polymer containing gas; and
adjusting parameters of the deposition step and adjusting parameters of the etching step until a predetermined trench depth and a predetermined sidewall angle are achieved.

11. The method according to claim 10 wherein said substrate is silicon.

12. The method according to claim 10 wherein said substrate is germanium.

13. The method according to claim 10 wherein said polymer containing gas is selected from the group consisting of fluorocarbon containing gases, hydrocarbon containing gases and combinations thereof.

14. The method according to claim 10 wherein said polymer containing gas is selected from the group consisting of $C_4F_8$, $CH_2F_2$, $CHF_3$ and combinations thereof.

15. The method according to claim 10 wherein said etchant containing gas is selected from the group consisting of $SF_6$, $CF_4$, $NF_3$ and combinations thereof.

16. The method according to claim 10 wherein said support member is maintained at temperatures ranging from about minus 40 degrees C. to about 20 degrees C. during the etch step.

17. A method of etching features in a substrate comprising:
placing said substrate on a support member in a vacuum chamber;
introducing at least one polymer containing gas into a vacuum chamber;
igniting a plasma from said polymer containing gas;
depositing a polymer on said substrate using said plasma of said polymer containing gas;
pulsing said depositing of said polymer, said pulsing having a process on-time of less than about two seconds;
repeating said pulsing of said depositing of said polymer;
introducing an etchant containing gas into said vacuum chamber;
igniting a plasma from said etchant containing gas;
etching said substrate using said plasma of said etchant containing gas; and
adjusting parameters of the deposition step and adjusting parameters of the etching step until a predetermined trench depth and a predetermined sidewall angle are achieved.

18. The method according to claim 17 wherein said substrate is silicon.

19. The method according to claim 17 wherein said substrate is germanium.

20. The method according to claim 17 wherein said polymer containing gas is selected from the group consisting of fluorocarbon containing gases, hydrocarbon containing gases and combinations thereof.

21. The method according to claim 17 wherein said polymer containing gas is selected from the group consisting of $C_4F_8$, $CH_2F_2$, $CHF_3$ and combinations thereof.

22. The method according to claim 17 wherein said etchant containing gas is selected from the group consisting of $SF_6$, $CF_4$, $NF_3$ and combinations thereof.

23. The method according to claim 17 wherein said support member is maintained at temperatures ranging from about minus 40 degrees C. to about 20 degrees C. during the etch step.

24. The method according to claim 17 further comprising:
introducing a scavenger containing gas into said vacuum chamber;
igniting a plasma from said scavenger containing gas; and
etching said substrate using said plasma of said scavenger containing gas.

25. The method according to claim 24 wherein said scavenger containing gas is an oxygen containing gas.

26. The method according to claim 25 wherein said oxygen containing gas is selected from the group consisting of $O_2$, $CO_2$ and combinations thereof.

* * * * *